(12) United States Patent
Hsieh et al.

(10) Patent No.: US 10,605,830 B2
(45) Date of Patent: Mar. 31, 2020

(54) PROBE CARD DEVICE AND RECTANGULAR PROBE THEREOF HAVING RING-SHAPED BRANCH SEGMENT

(71) Applicant: CHUNGHWA PRECISION TEST TECH. CO., LTD., Taoyuan (TW)

(72) Inventors: Chih-Peng Hsieh, Taipei (TW); Yen-Chen Chen, Taipei (TW); Wei-Jhih Su, Taichung (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 90 days.

(21) Appl. No.: 15/942,180

(22) Filed: Mar. 30, 2018

(65) Prior Publication Data
US 2019/0212367 A1 Jul. 11, 2019

(30) Foreign Application Priority Data

Jan. 10, 2018 (TW) .............................. 107100931 A

(51) Int. Cl.
*G01R 31/20* (2006.01)
*G01R 1/073* (2006.01)

(52) U.S. Cl.
CPC ..... *G01R 1/07371* (2013.01); *G01R 1/07314* (2013.01); *G01R 1/07342* (2013.01); *G01R 1/07357* (2013.01)

(58) Field of Classification Search
CPC ............ G01R 1/07342; G01R 31/2891; G01R 31/2889; G01R 1/07314; G01R 1/07307; G01R 1/07357; G01R 1/0491; G01R 1/07378; G01R 1/07371; G01R 1/0408; G01R 31/26; G01R 1/06733; G01R 1/073; G01R 1/06772; G01R 31/2886; G01R 1/06794; G01R 31/2831; G01R 1/0466; G01R 1/06705; G01R 1/06711; G01R 1/04; G01R 1/067; G01R 1/06716; G01R 1/06727; G01R 1/0416; G01R 1/06744; G01R 1/06722; G01R 1/06777; G01R 31/00; H01L 2225/06517; H01L 22/30;

(Continued)

(56) References Cited

U.S. PATENT DOCUMENTS 4,505,529 A * 3/1985 Barkus ................. H01R 12/714 439/82
7,452,248 B2 * 11/2008 Seo ....................... H01R 12/585 439/751

(Continued)

*Primary Examiner* — Vinh P Nguyen
(74) *Attorney, Agent, or Firm* — Li & Cai Intellectual Property (USA) Office

(57) ABSTRACT

A probe card device and a rectangular probe thereof are provided. The rectangular probe includes a branch segment, a first contacting segment and a second contacting segment. The branch segment is ring-shaped and has a perforation, and the branch segment includes two branch arms respectively located at two sides of the perforation. The first contacting segment is located at a side of the branch segment and is pierced through a first through hole of a first guide plate. The second contacting segment is located at the other side of the branch segment. A maximum width portion of the branch segment has a variable width greater than a hole size of the first through hole, and the two branch arms of the branch segment are compressible to enable the variable width to be less than or equal to the hole size of the first through hole.

11 Claims, 9 Drawing Sheets

(58) Field of Classification Search
CPC ..... H01L 24/97; H01R 12/52; H01R 13/2407; H01R 12/714; H01R 13/2442; H01R 12/728; H01R 13/24; H01R 13/2464; H01R 2201/20; H01R 12/7082; H01R 4/48; H01R 11/18; H01R 13/6215; H01R 43/00; H01R 43/0214; H01R 9/096; H01R 12/523; H01R 12/62; H01R 12/7076; H01R 13/2414; H01R 43/16
See application file for complete search history.

(56) References Cited

U.S. PATENT DOCUMENTS 8,613,622 B2 * 12/2013 Garcia ............... H01R 13/2421
 439/66
9,431,733 B1 * 8/2016 Heistand ................ H01R 43/16

* cited by examiner

PROBE CARD DEVICE AND RECTANGULAR PROBE THEREOF HAVING RING-SHAPED BRANCH SEGMENT

BACKGROUND OF THE INVENTION

1. Field of the Invention

The present disclosure relates to a probe card, and in particular, to a probe card device and a rectangular probe thereof.

2. Description of Related Art

Referring to FIG. 1, a conventional probe card device 100a usually includes a protruding tenon 11a designed on a probe 1a to limit a moving space of the probe 1a relative to a probe holder 2a. However, when the conventional probe card device 100a is in a probe implanting process, the situation that the probe 1a cannot be smoothly implanted into the probe holder 2a (such as the tenon 11a of the probe 1a is stuck in a through hole 22a of a guide plate 21a) may be occurred, or the situation that the guide plate 21a of the probe holder 2a is scratched by the tenon 11a of the probe 1a may be occurred.

In this regard, the present disclosure provides a probe card device and a rectangular probe thereof to overcome the aforementioned drawbacks.

SUMMARY OF THE INVENTION

The main object of the present disclosure is to solve the drawbacks associated with the prior art.

The present disclosure provides a probe card device including a first guide plate having a plurality of first through holes; and a plurality of rectangular probes respectively passed through the first through holes of the first guide plate, and each of the rectangular probes including a branch segment in a ring-shape and having a perforation, and the branch segment including two branch arms respectively located at two sides of the perforation; a first contacting segment located at a side of the branch segment and pierced through the corresponding first through hole; and a second contacting segment located at the other side of the branch segment; in which in each of the rectangular probes, a maximum width portion of the branch segment has a variable width greater than a hole size of the corresponding first through hole, and the two branch arms of the branch segment are capable of being compressed to enable the variable width to be less than or equal to the hole size of the corresponding first through hole; in which a sum of widths of the two branch arms is greater than a width of the first contacting segment and is greater than a width of the second contacting segment.

The present disclosure also provides a rectangular probe of a probe card device including a branch segment in a ring-shape and having a perforation, and the branch segment including two branch arms respectively located at two sides of the perforation; a first contacting segment located at a side of the branch segment and pierced through a first through hole of a first guide plate; and a second contacting segment located at the other side of the branch segment; in which a maximum width portion of the branch segment has a variable width greater than a hole size of the first through hole, and the two branch arms of the branch segment are capable of being compressed to enable the variable width to be less than or equal to the hole size of the first through hole; in which a sum of widths of the two branch arms is greater than a width of the first contacting segment and is greater than a width of the second contacting segment.

The present disclosure further provides a rectangular probe of a probe card device including a branch segment in a ring-shape and having a perforation, and the branch segment including two branch arms respectively located at two sides of the perforation; a first contacting segment located at a side of the branch segment and pierced through a first through hole of a first guide plate; and a second contacting segment located at the other side of the branch segment; in which a maximum width portion of the branch segment has a variable width greater than a hole size of the first through hole, and the two branch arms of the branch segment are capable of being compressed to enable the variable width to be less than or equal to the hole size of the first through hole; in which a sum of widths of the two branch arms is 80% to 175% of a width of the first contacting segment, the sum of the widths of the two branch arms is 80% to 175% of a width of the second contacting segment, and the sum of the widths of the two branch arms is 60% to 85% of the hole size of the first through hole.

As described above, the probe card device and the rectangular probe of the present disclosure enable the branch segment of the rectangular probe to be smoothly passed through the first through hole without scratching the first guide plate by virtue of the two branch arms of the branch segment capable of being compressed to enable the variable width to be less than or equal to the hole size of the corresponding first through hole so that the smoothness of the probe implanting process can be further enhanced.

For further understanding of the present disclosure, the following embodiments are provided along with illustrations to facilitate the disclosure of the present disclosure.

DETAILED DESCRIPTION OF PREFERRED EMBODIMENTS

Figure 1:
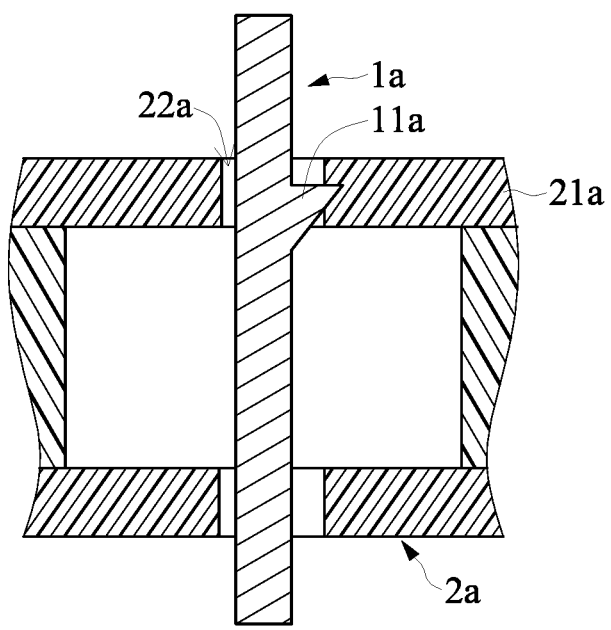
FIG. 1 is a perspective view showing a conventional probe card device in the related art.

The aforementioned illustrations and following detailed descriptions are exemplary for the purpose of further explaining the scope of the instant disclosure. Other objectives and advantages related to the instant disclosure will be illustrated in the subsequent descriptions and appended drawings. In addition, for an easy instruction, similar reference numbers or symbols refer to elements alike.

First Embodiment

Referring to FIG. 2 to FIG. 8, a first embodiment of the present disclosure is illustrated. Please firstly refer to FIG. 2 to FIG. 4B. The present embodiment discloses a probe card device 100 which includes a probe holder 1 and a plurality of rectangular probes 2. The probe holder 1 includes a first guide plate 11 (upper die) and a second guide plate 12 (lower die). The first guide plate 11 is spaced from the second guide plate 12 and is substantially parallel to the second guide plate 12. One end of each rectangular probe 2=is passed through the first guide plate 11 and the other end of each rectangular probe 2 is passed through the second guide plate 12 (as shown in FIG. 4A and FIG. 4B). In addition, the probe holder 1 includes a spacer 13 disposed between the first guide plate 11 and the second guide plate 12, but the present disclosure is not limited thereto.

It should be noted that although the rectangular probes 2 of the present embodiment are described with the probe holder 1 (including the first guide plate 11, the second guide plate 12 and the spacer 13), the practical application of the rectangular probes 2 is not limited thereto. That is, the rectangular probes 2 may be sold separately or applied to other components (i.e. only cooperating with the first guide plate 11). Furthermore, for facilitating the understanding of the present embodiment, the drawings only show a partial configuration of the probe card device 100 to clearly present the structure of each component of the probe card device 100 and the connection relationship thereof. The structure of each component of the probe card device 100 of the present embodiment and the connection relationship thereof will be respectively described below.

Figure 4A:
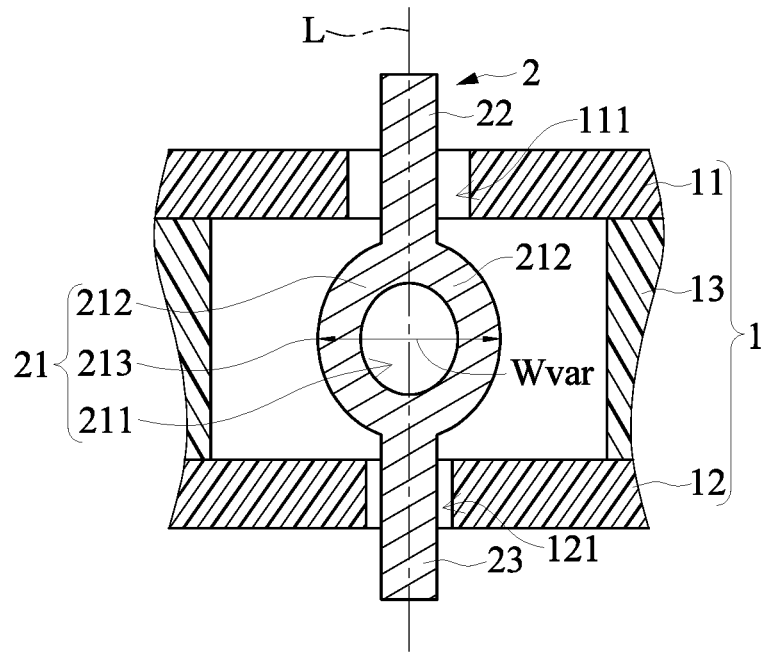
FIG. 4A is a perspective view (a) showing the probe card device according to the first embodiment of the present disclosure.
Figure 4B:
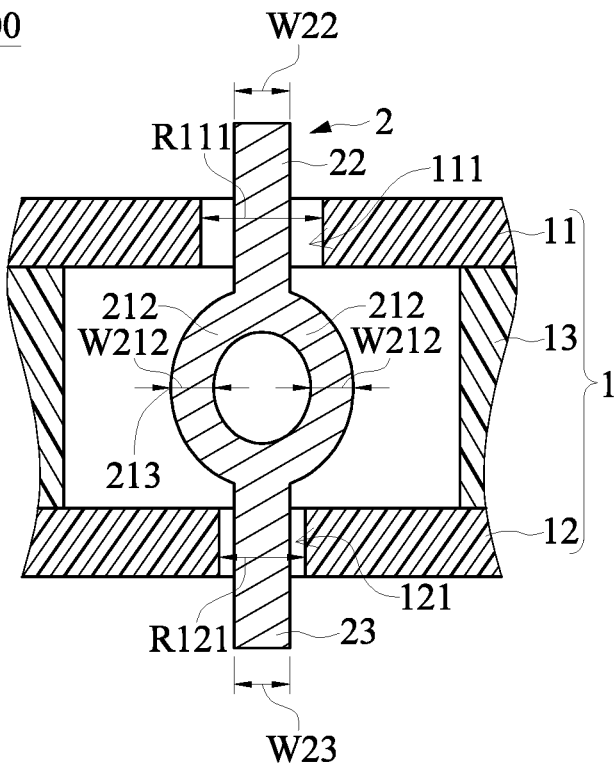
FIG. 4B is a perspective view (b) showing the probe card device according to the first embodiment of the present disclosure.

The first guide plate 11 of the probe holder 1 has a plurality of first through holes 111, and the second guide plate 12 of the probe holder 1 has a plurality of second through holes 121, in which positions of the second through holes 121 respectively correspond to positions of the first through holes 111, and a hole size R121 of each of the second through holes 121 is less than a hole size R111 of the corresponding first through hole 111 (as shown in FIG. 4B).

The rectangular probes 2 are substantially arranged in a matrix, and each of the rectangular probes 2 is sequentially passed through the corresponding first through hole 111 of the first guide plate 11, the spacer 13, and the corresponding second through holes 121 of the second guide plate 12. Since the above-mentioned spacer 13 has a low correlation with the improvement emphasis of the present disclosure, the structure of the spacer 13 will not be described in detail below.

Since the structures of the rectangular probes 2 of the present embodiment are substantially the same, the drawings and the following description will take a single rectangular probe 2 as an example, but the present disclosure is not limited thereto. For example, in the non-illustrated embodiment of the present disclosure, the rectangular probes 2 may also have different structures from each other.

In the present embodiment, the rectangular probe 2 is a conductive and flexible structure. In addition, the material of the rectangular probe 2 may be gold (Au), silver (Ag), copper (Cu), nickel (Ni), cobalt (Co) or alloys thereof. The material of the rectangular probe 2 is preferably at least one of copper, copper alloy, nickel-cobalt alloy, palladium nickel alloy, nickel manganese alloy, nickel tungsten alloy, nickel phosphorus alloy and palladium cobalt alloy, but the rectangular probe 2 of the present disclosure is not limited to the above-mentioned materials.

Please continuously refer to FIG. 4A and FIG. 4B. The rectangular probe 2 includes a branch segment 21, a first contacting segment 22 located at a side of the branch segment 21 (as located at the upper side of the branch segment 21 in FIG. 4A), and a second contacting segment 23 located at the other side of the branch segment 21 (as located at the lower side of the branch segment 21 in FIG. 4A). The branch segment 21 is substantially located between the first guide plate 11 and the second guide plate 12. The first contacting segment 22 is pierced through the corresponding first through hole 111 of the first guide plate 11 and is configured to contact a signal transfer board (not shown in FIGS. 4A and 4B). The second contacting segment 23 is pierced through the corresponding second through hole 121 of the second guide plate 12 and is configured to contact and test an object to be tested (not shown in FIGS. 4A and 4B, such as a semiconductor wafer).

More specifically, the branch segment 21 of the rectangular probe 2 is in a ring-shape and has a perforation 211, and the branch segment 21 includes two branch arms 212 respectively located at two sides of the perforation 211 (as located at the left side and the right side of the perforation 211 in FIG. 4A). It should be noted that the above-mentioned "ring-shape" may be circular, elliptical, semicircular, rhombic, or irregularly shaped, and the present disclosure is not limited thereto.

Figure 3:
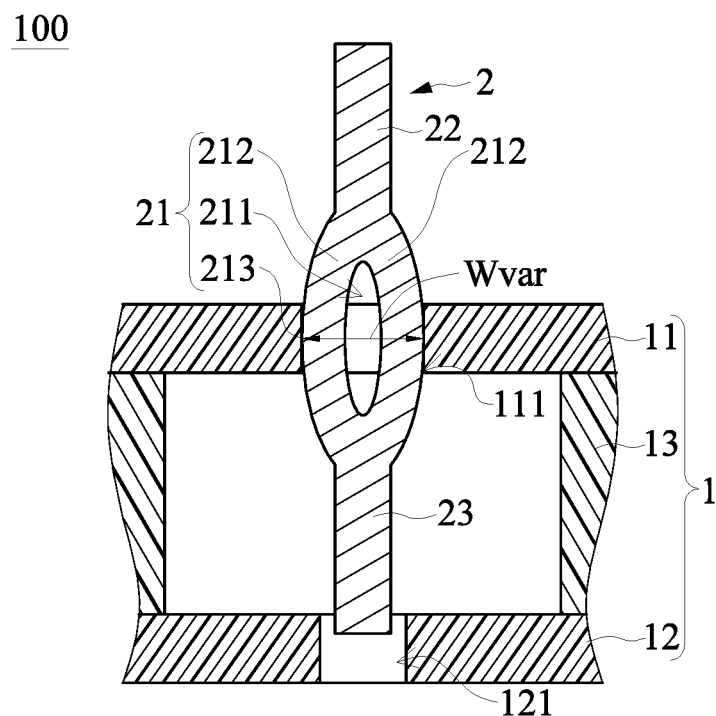
FIG. 3 is a perspective view (b) showing the probe implanting process of the probe card device according to the first embodiment of the present disclosure.

Furthermore, a maximum width portion 213 of the branch segment 21 has a variable width Wvar greater than a hole size R111 of the corresponding first through hole 111 (as shown in FIGS. 4A and 4B), and the two branch arms 212 of the branch segment 21 are capable of being compressed to enable the variable width Wvar to be less than or equal to the hole size R111 of the corresponding first through hole 111 (as shown in FIG. 3). More specifically, a sum of widths W212 of the two branch arms 212 is 60% to 85% of the hole size R111 of the corresponding first through hole 111 (as shown in FIG. 4B) so that when the two branch arms 212 of the branch segment 21 are compressed, the two branch arms 212 approach towards each other and the variable width Wvar is less than or equal to the hole size R111 of the corresponding first through hole 111 (as shown in FIG. 3).

Figure 2:
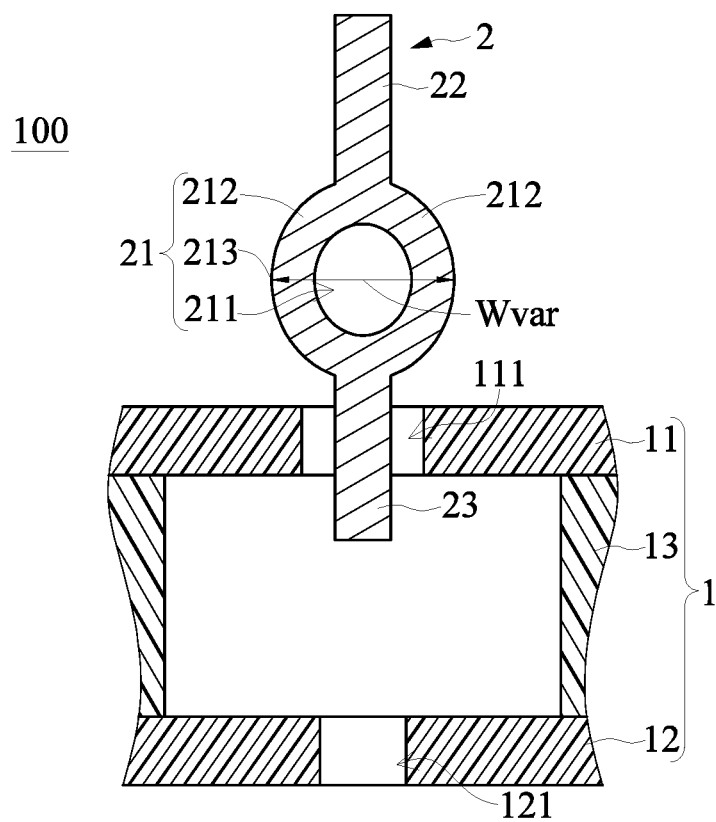
FIG. 2 is a perspective view (a) showing a probe implanting process of a probe card device according to a first embodiment of the present disclosure.

According to the above configuration, the probe card device 100 of the present embodiment enables the branch segment 21 of the rectangular probe 2 to be passed through the first through hole 111 of the first guide plate 11 (as shown in FIG. 3) from an upper side of the first guide plate 11 (as shown in FIG. 2) and to be located between the first guide plate 11 and the second guide plate 12 (as shown in FIGS. 4A and 4B) in a probe implanting process. When the branch segment 21 of the rectangular probe 2 is passed through the first through hole 111 of the first guide plate 11, the two branch arms 212 of the branch segment 21 are capable of being compressed to enable the variable width Wvar to be less than or equal to the hole size R111 of the corresponding first through hole 111 (as shown in FIG. 3). Therefore, the branch segment 21 of the rectangular probe 2 can be smoothly passed through the first through hole 111 without scratching the first guide plate 11 to further enhance the smoothness of the probe implanting process. In addition, since the maximum width portion 213 of the branch segment 21 has the variable width Wvar greater than the hole size R111 of the corresponding first through hole 111, the branch segment 21 is capable of being elastically actuated between the first guide plate 11 and the second guide plate 12 of the probe holder 1 without being separated from the probe holder 1 when the branch segment 21 is located between the first guide plate 11 and the second guide plate 12 (as shown in FIGS. 4A and 4B).

Please continuously refer to FIG. 4B. The sum of the widths W212 of the two branch arms 212 is greater than a width W22 of the first contacting segment 22 and is greater than a width W23 of the second contacting segment 23. Preferably, the sum of the widths W212 of the two branch arms 212 is not greater than 175% of the width W22 of the first contacting segment 22, and the sum of the widths W212 of the two branch arms 212 is not greater than 175% of the width W23 of the second contacting segment 23, but the present disclosure is not limited thereto. In another embodiment of the present disclosure, the sum of the widths W212 of the two branch arms 212 is 80% to 175% of the width W22 of the first contacting segment 22, and the sum of the widths W212 of the two branch arms 212 is 80% to 175% of the width W23 of the second contacting segment 23.

Accordingly, since the branch segment 21 of the rectangular probe 2 includes the two branch arms 212, the two branch arms 212 can be used to disperse the current (i.e. detection current) provided by the detection device and can be used to buffer the pressure applied by the detection device (i.e. pressing-down pressure) when the probe card device 100 detects the object to be tested (such as a semiconductor wafer) so as to enhance the reliability and the service life of the rectangular probe 2.

It should be noted that although the first guide plate 11 is the upper die and the second guide plate 12 is the lower die in the present embodiment, in practical applications, the first guide plate 11 may be the lower die and the second guide plate 12 may be the upper die.

Figure 5:
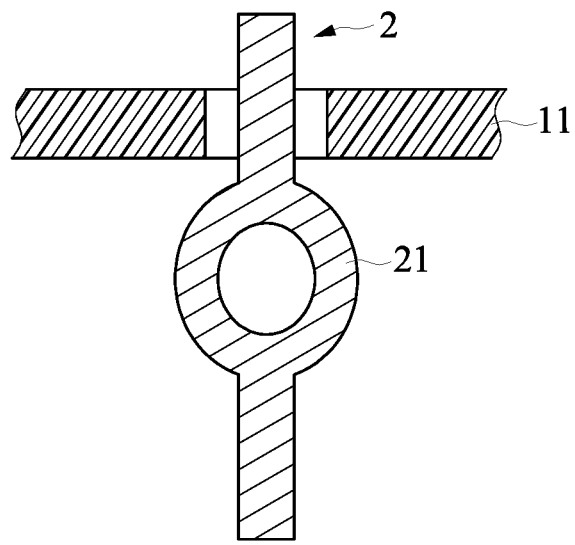
FIG. 5 is a perspective view showing the probe card device only including a first guide plate, and showing a branch segment of a rectangular probe being located at a lower side of the first guide plate according to the first embodiment of the present disclosure.
Figure 6:
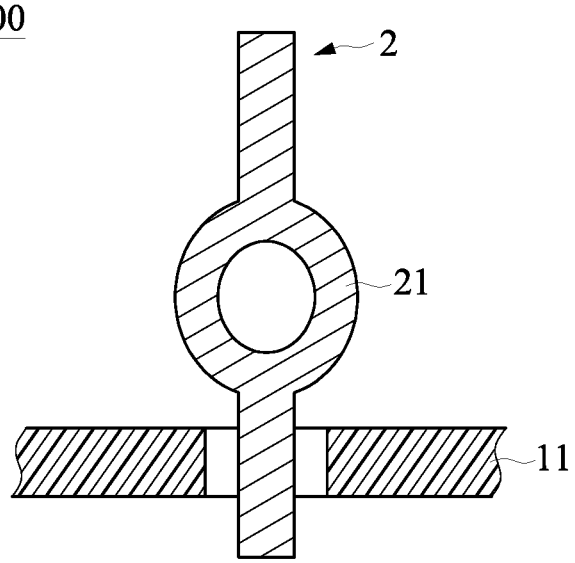
FIG. 6 is a perspective view showing the probe card device only including the first guide plate, and showing the branch segment of the rectangular probe being located at an upper side of the first guide plate according to the first embodiment of the present disclosure.

Furthermore, in the present embodiment, the probe card device 100 includes the first guide plate 11 and the second guide plate 12. However, in practical applications, the probe card device 100 may only include the first guide plate 11 (as shown in FIG. 5 and FIG. 6), and not include the second guide plate 12; and the branch segment 21 of the rectangular probe 2 may be located at the lower side of the first guide plate 11 (as shown in FIG. 5) or may be located at the upper side of the first guide plate 11 (as shown in FIG. 6).

Figure 7:
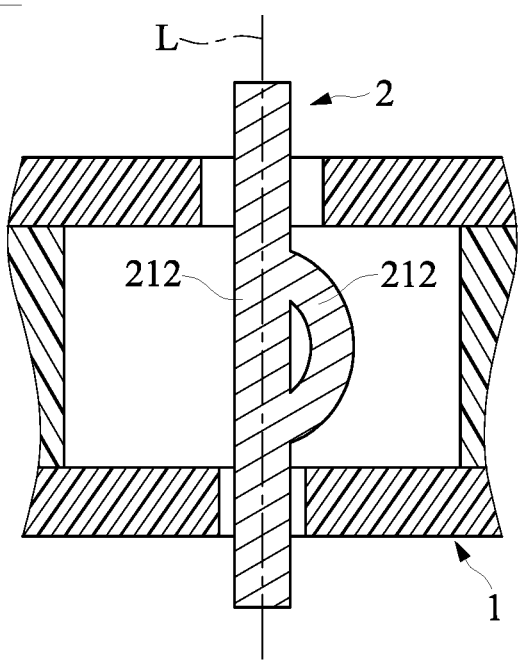
FIG. 7 is a perspective view showing two branch arms being asymmetrically disposed relative to a center line of the rectangular probe according to the first embodiment of the present disclosure.
Figure 8:
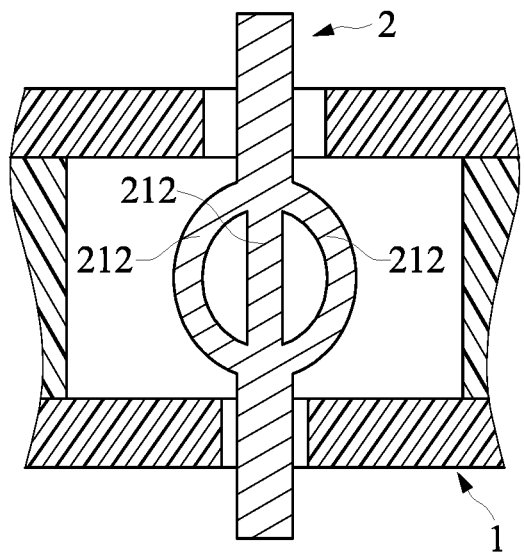
FIG. 8 is a perspective view showing the number of the branch arms being three according to the first embodiment of the present disclosure.

In addition, in the present embodiment, the two branch arms 212 of the branch segment 21 are symmetrically disposed with respect to a center line L of the rectangular probe 2 (as shown in FIG. 4A). However, in practical applications, the two branch arms 212 of the branch segment 21 may also be asymmetrically disposed relative to the center line L of the rectangular probe 2 (as shown in FIG. 7). Furthermore, although the number of the branch arms 212 of the branch segment 21 in the present embodiment is two (as shown in FIG. 4A), in practical applications, the number of the branch arms 212 of the branch segment 21 may be three (as shown in FIG. 8) or greater than four, and the present disclosure is not limited thereto.

Second Embodiment

Figure 9:
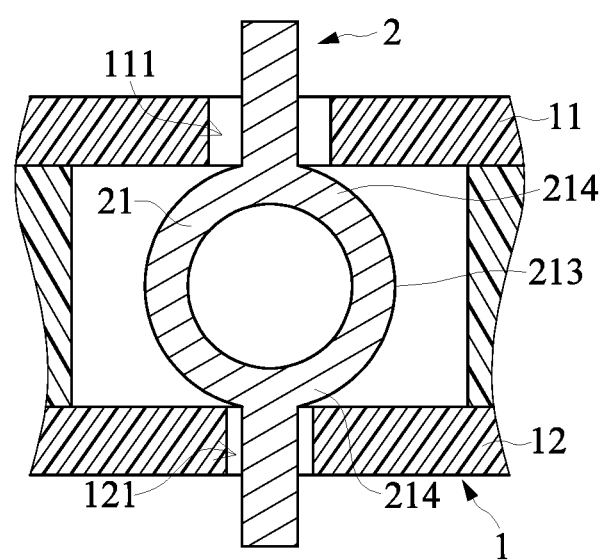
FIG. 9 is a perspective view showing the probe card device according to a second embodiment of the present disclosure.

Referring to FIG. 9, a second embodiment of the present disclosure is illustrated. The present embodiment is substantially the same as the first embodiment described above, and the differences between the two embodiments are described as follows. In each of the rectangular probes 2, the corresponding first through hole 111, and the corresponding second through hole 121, two end portions 214 of the branch segment 21 respectively close to the first guide plate 11 and the second guide plate 12 are configured to respectively abut against the first guide plate 11 and the second guide plate 12 so that the branch segment 21 is sandwiched between the first guide plate 11 and the second guide plate 12.

In addition, widths of the branch segment 21 are gradually increased from the two end portions 214 toward the maximum width portion 213. When the probe card device 100 detects the object to be tested, the first through hole 111 is directly opposite to the second through hole 121 (the first through hole 111 and the second through hole 121 are not dislocated from each other). In other words, when the first guide plate 11 and the second guide plate 12 are respectively and orthogonally projected onto a plane along their normal vectors, the second through hole 121 is located inside an outline of the first through hole 111 (not shown).

Therefore, the rectangular probe 2 can be more stably fixed between the first guide plate 11 and the second guide plate 12, and the first through hole 111 and the second through hole 121 need not to be dislocated from each other (the rectangular probe 2 does not fall out of the first guide plate 11 and the second guide plate 12).

Furthermore, since the branch segment 21 of the rectangular probe 2 of the present embodiment has a buffer function (such as buffering the pressure applied by the detection device), it can replace the designs that the portion of the probe 1a in the probe holder 2a needs to be bent and the through holes 22a of the upper and lower guide plates 21a are dislocated from each other (not shown) when the conventional probe card device 100a detects the object to be tested.

Third Embodiment

Figure 10:
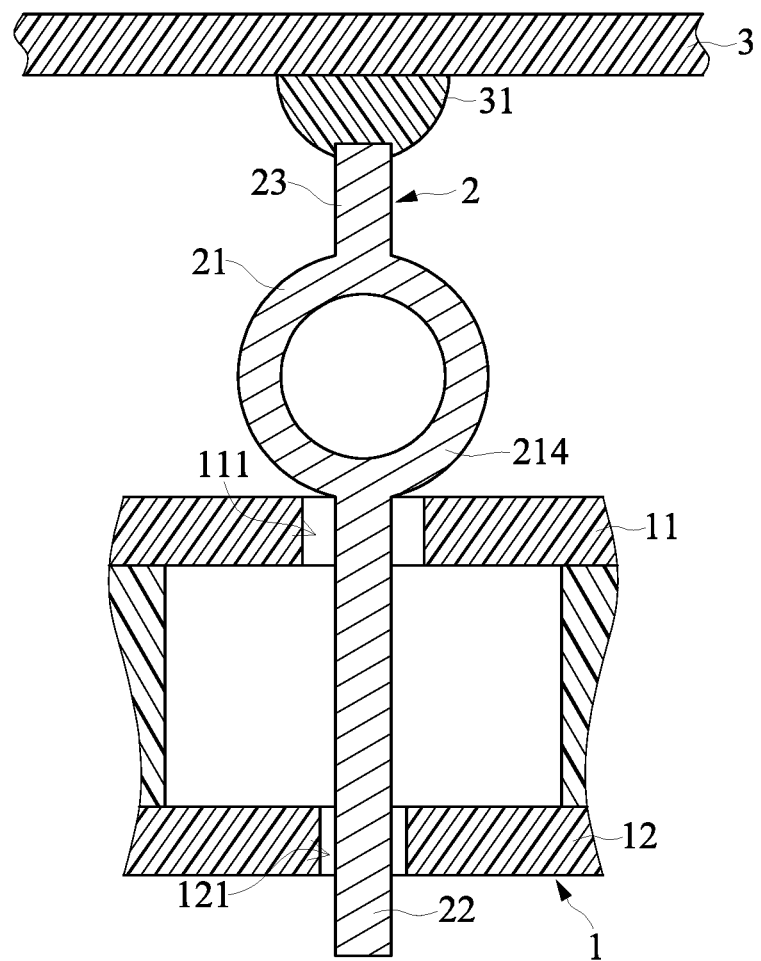
FIG. 10 is a perspective view showing the probe card device according to a third embodiment of the present disclosure.

Referring to FIG. 10, a third embodiment of the present disclosure is illustrated. The present embodiment is substantially the same as the first embodiment described above, and the difference of the present embodiment compared to the first embodiment is that the branch segment 21 of the rectangular probe 2 is not located between the first guide plate 11 and the second guide plate 12 but is located at a side of the probe holder 1 (as located at the upper side of the probe holder 1 in FIG. 10). In addition, the positional relationship of the first contacting segment 22 and the second contacting segment 23 in the present embodiment is opposite to that of the first embodiment. As shown in FIG. 4A, the first contacting segment 22 of the first embodiment is located at the upper side of the second contacting segment 23. As shown in FIG. 10, the first contacting segment 22 of the present embodiment is located at the lower side of the second contacting segment 23.

More particularly, the probe card device 100 of the present embodiment further includes a signal transfer board 3, and the signal transfer board 3 includes a plurality of electrical contacts 31 respectively corresponding to the second contacting segments 23 of the rectangular probes 2. In addition, in each of the rectangular probes 2, an end portion 214 of the branch segment 21 close to the first guide plate 11 is configured to abut against the first guide plate 11 so that the branch segment 21 is located at a side of the first guide plate 11 (as located at the upper side of the first guide plate 11 in FIG. 10). The first contacting segment 22 is sequentially pierced through the corresponding first through hole 111 and the corresponding second through hole 121. The second guide plate 12 is located at the other side of the first guide plate 11 (as located at the lower side of the first guide plate 11 in FIG. 10). An end of the second contacting segment 23 is configured to abut on the corresponding electrical contact 31 of the signal transfer board 3. Preferably, a length of the second contacting segment 23 of the present embodiment is shorter than a length of the first contacting segment 22, but the present disclosure is not limited thereto.

Therefore, the probe card device 100 enables the rectangular probe 2 to be stably fixed on the probe holder 1 by virtue of the branch segment 21 of the rectangular probe 2 abutting against the upper side of the probe holder 1 (not located between the first guide plate 11 and the second guide plate 12) and the first contacting segment 22 being sequentially pierced through the corresponding first through hole 111 and the corresponding second through hole 121.

Fourth Embodiment

Figure 11:
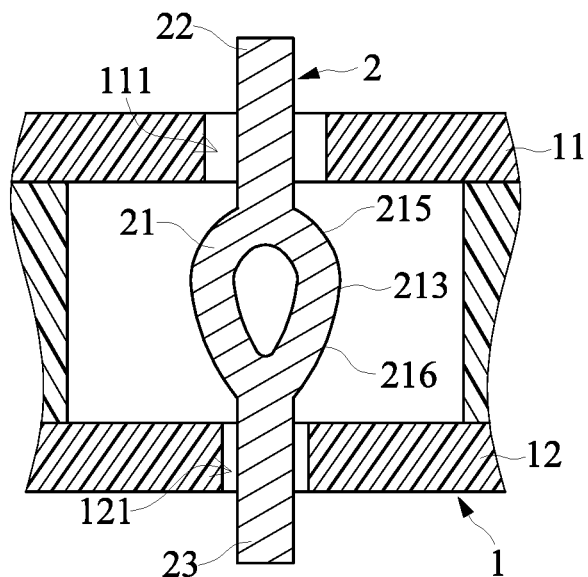
FIG. 11 is a perspective view showing the probe card device according to a fourth embodiment of the present disclosure.

Referring to FIG. 11, a fourth embodiment of the present disclosure is illustrated. The present embodiment is substantially the same as the first embodiment described above, and the difference of the present embodiment compared to the first embodiment is the outer-shape design of the branch segment 21 of the rectangular probe 2. More particularly, in each of the rectangular probes 2, an outer surface of the branch segment 21 includes a limiting portion 215 and a guiding portion 216, the limiting portion 215 is located between the maximum width portion 213 and the first contacting segment 22, and the guiding portion 216 is located between the maximum width portion 213 and the second contacting segment 23. The width of the guiding portion 216 is less than the width of the limiting portion 215. That is, the branch segment 21 is designed to be wider in its upper portion and narrower in its lower portion as shown in FIG. 11. Moreover, the branch segment 21 can be passed through the corresponding first through hole 111 more smoothly through the guiding portion 216, and the limiting portion 215 can limit the branch segment 21 from passing out of the first through hole 111.

More particularly, the limiting portion 215 is a convex curved surface, and the width of the limiting portion 215 is gradually increased from the first contacting segment 22 toward the second contacting segment 23. In addition, the guiding portion 216 is at least one of a convex curved surface, a planar surface, and a concave curved surface (the present embodiment is a convex curved surface), and the width of the guiding portion 216 is gradually decreased from the first contacting segment 22 toward the second contacting segment 23 in which a curvature of the guiding portion 216 is less than a curvature of the limiting portion 215, but the present disclosure is not limited thereto.

Fifth Embodiment

Figure 12:
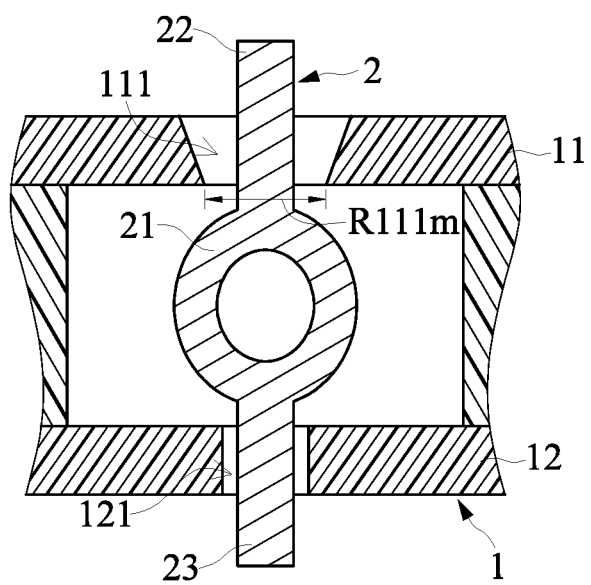
FIG. 12 is a perspective view showing the probe card device according to a fifth embodiment of the present disclosure.

Referring to FIG. 12, a fifth embodiment of the present disclosure is illustrated. The present embodiment is substantially the same as the first embodiment described above, and the difference of the present embodiment compared to the first embodiment is the hole-shape design of the first through hole 111. More specially, in each of the rectangular probes 2 and the corresponding first through hole 111, the hole size R111 of the first through hole 111 is gradually decreased from the first contacting segment 22 toward the second contacting segment 23. That is, the first through hole 111 of the present embodiment is a shrink hole (the first through hole 111 of the first embodiment is a straight hole). Therefore, the branch segment 21 of the rectangular probe 2 can be passed through the first through hole 111 more smoothly through the hole-shaped design of the first through hole 111.

It should be noted that the shape of the first through hole 111 in the present embodiment preferably corresponds to the shape of the guiding portion 216 in the fourth embodiment so as to greatly improve the smoothness of the probe implanting process.

In addition, the sum of the widths W212 of the two branch arms 212 of the present embodiment is 60% to 70% of the minimum hole size of the corresponding first through hole 111.

Sixth Embodiment

Figure 13:
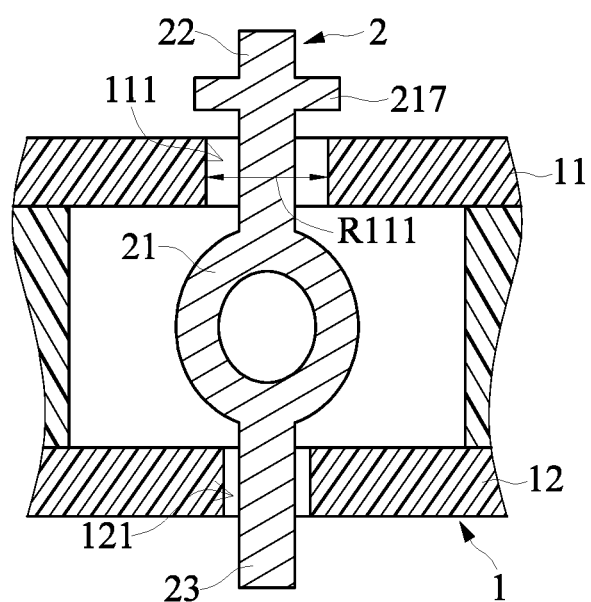
FIG. 13 is a perspective view showing the probe card device according to a sixth embodiment of the present disclosure.

Referring to FIG. 13, a sixth embodiment of the present disclosure is illustrated. The present embodiment is substantially the same as the first embodiment described above, and the differences between the two embodiments are described as follows. Each of the rectangular probes 2 includes a feature portion 217 formed on the first contacting segment 22, and a sum of widths of the feature portion 217 and the first contacting segment 22 is greater than the hole size R111 of the corresponding first through hole 111. Therefore, the probe card device 100 can prevent the first contacting segment 22 from completely falling into the probe holder 1 (between the first guide plate 11 and the second guide plate 12).

Advantageous Effects of the Present Disclosure

As described above, the probe card device 100 and the rectangular probe 2 of the present disclosure enable the branch segment 21 of the rectangular probe 2 to be smoothly passed through the first through hole 111 without scratching the first guide plate 11 by virtue of the two branch arms 212 of the branch segment 21 capable of being compressed to enable the variable width Wvar to be less than or equal to the hole size R111 of the corresponding first through hole 111 so that the smoothness of the probe implanting process can be further enhanced.

In addition, since the branch segment 21 of the rectangular probe 2 includes the two branch arms 212, the two branch arms 212 can be used to disperse the current (i.e.

detection current) provided by the detection device and can be used to buffer the pressure applied by the detection device (i.e. pressing-down pressure) when the probe card device 100 detects the object to be tested (such as a semiconductor wafer) so as to enhance the reliability and the service life of the rectangular probe 2.

The descriptions illustrated supra set sixth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A probe card device, comprising:
   a first guide plate having a plurality of first through holes; and
   a plurality of rectangular probes respectively passed through the first through holes of the first guide plate, and each of the rectangular probes including:
      a branch segment in a ring-shape and having a perforation, and the branch segment including two branch arms respectively located at two sides of the perforation;
      a first contacting segment located at a side of the branch segment and pierced through the corresponding first through hole; and
      a second contacting segment located at the other side of the branch segment;
   wherein in each of the rectangular probes, a maximum width portion of the branch segment has a variable width greater than a hole size of the corresponding first through hole, and the two branch arms of the branch segment are capable of being compressed to enable the variable width to be less than or equal to the hole size of the corresponding first through hole;
   wherein a sum of widths of the two branch arms is greater than a width of the first contacting segment and is greater than a width of the second contacting segment.

2. The probe card device according to claim 1, wherein in each of the rectangular probes, the sum of the widths of the two branch arms is not greater than 175% of the width of the first contacting segment, the sum of the widths of the two branch arms is not greater than 175% of the width of the second contacting segment, and the sum of the widths of the two branch arms is 60% to 85% of the hole size of the corresponding first through hole.

3. The probe card device according to claim 1, further comprising:
   a second guide plate spaced from the first guide plate and substantially parallel to the first guide plate, the second guide plate having a plurality of second through holes;
   wherein the rectangular probes are respectively passed through the second through holes of the second guide plate, positions of the second through holes respectively correspond to positions of the first through holes, and a hole size of each of the second through holes is less than the hole size of the corresponding first through hole;
   wherein in each of the rectangular probes, the branch segment is substantially located between the first guide plate and the second guide plate, and the second contacting segment is pierced through the corresponding second through hole.

4. The probe card device according to claim 3, wherein in each of the rectangular probes, the corresponding first through hole, and the corresponding second through hole, two end portions of the branch segment are configured to respectively abut against the first guide plate and the second guide plate so that the branch segment is sandwiched between the first guide plate and the second guide plate; wherein widths of the branch segment are gradually increased from the two end portions toward the maximum width portion; wherein when the first guide plate and the second guide plate are respectively and orthogonally projected onto a plane along their normal vectors, the second through hole is located inside an outline of the first through hole.

5. The probe card device according to claim 1, further comprising:
   a second guide plate spaced from the first guide plate and substantially parallel to the first guide plate, the second guide plate having a plurality of second through holes; wherein the rectangular probes are respectively passed through the second through holes of the second guide plate, positions of the second through holes respectively correspond to positions of the first through holes; and
   a signal transfer board including a plurality of electrical contacts respectively corresponding to the first contacting segments of the rectangular probes;
   wherein in each of the rectangular probes, an end portion of the branch segment is configured to abut against the first guide plate so that the branch segment is located at a side of the first guide plate; the second contacting segment is sequentially pierced through the corresponding first through hole and the corresponding second through hole, the second guide plate is located at the other side of the first guide plate, and an end of the first contacting segment is configured to abut on the corresponding electrical contact of the signal transfer board.

6. The probe card device according to claim 1, wherein in each of the rectangular probes, an outer surface of the branch segment includes a limiting portion and a guiding portion, the limiting portion is located between the maximum width portion and the first contacting segment, and the guiding portion is located between the maximum width portion and the second contacting segment; wherein the limiting portion is a convex curved surface, and the guiding portion is at least one of a convex curved surface, a planar surface, and a concave curved surface; wherein a curvature of the guiding portion is less than a curvature of the limiting portion.

7. The probe card device according to claim 1, wherein in each of the rectangular probes and the corresponding first through hole, the hole size of the first through hole is gradually decreased from the first contacting segment toward the second contacting segment.

8. The probe card device according to claim 1, wherein in each of the rectangular probes, a feature portion is formed on the first contacting segment, and a sum of widths of the feature portion and the first contacting segment is greater than the hole size of the corresponding first through hole.

9. A rectangular probe of a probe card device, comprising:
   a branch segment in a ring-shape and having a perforation, and the branch segment including two branch arms respectively located at two sides of the perforation;
   a first contacting segment located at a side of the branch segment and pierced through a first through hole of a first guide plate; and
   a second contacting segment located at the other side of the branch segment;

wherein a maximum width portion of the branch segment has a variable width greater than a hole size of the first through hole, and the two branch arms of the branch segment are capable of being compressed to enable the variable width to be less than or equal to the hole size of the first through hole;

wherein a sum of widths of the two branch arms is greater than a width of the first contacting segment and is greater than a width of the second contacting segment.

10. The rectangular probe of the probe card device according to claim 9, wherein the sum of the widths of the two branch arms is not greater than 175% of the width of the first contacting segment, the sum of the widths of the two branch arms is not greater than 175% of the width of the second contacting segment, and the sum of the widths of the two branch arms is 60% to 85% of the hole size of the first through hole.

11. A rectangular probe of a probe card device, comprising:
- a branch segment in a ring-shape and having a perforation, and the branch segment including two branch arms respectively located at two sides of the perforation;
- a first contacting segment located at a side of the branch segment and pierced through a first through hole of a first guide plate; and
- a second contacting segment located at the other side of the branch segment;

wherein a maximum width portion of the branch segment has a variable width greater than a hole size of the first through hole, and the two branch arms of the branch segment are capable of being compressed to enable the variable width to be less than or equal to the hole size of the first through hole;

wherein a sum of widths of the two branch arms is 80% to 175% of a width of the first contacting segment, the sum of the widths of the two branch arms is 80% to 175% of a width of the second contacting segment, and the sum of the widths of the two branch arms is 60% to 85% of the hole size of the first through hole.

* * * * *